(12) United States Patent
Sandhu

(10) Patent No.: US 11,011,647 B2
(45) Date of Patent: *May 18, 2021

(54) SEMICONDUCTOR DEVICES COMPRISING CHANNEL MATERIALS

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/587,921

(22) Filed: Sep. 30, 2019

(65) Prior Publication Data

US 2020/0027990 A1 Jan. 23, 2020

Related U.S. Application Data

(60) Continuation of application No. 16/004,908, filed on Jun. 11, 2018, now Pat. No. 10,446,692, which is a
(Continued)

(51) Int. Cl.
*H01L 29/772* (2006.01)
*H01L 29/66* (2006.01)
(Continued)

(52) U.S. Cl.
CPC .......... *H01L 29/7869* (2013.01); *B82Y 10/00* (2013.01); *H01L 21/823437* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 4,903,189 A 2/1990 Ngo et al.
5,061,976 A * 10/1991 Shimomura ......... G01N 27/414
257/414
(Continued)

FOREIGN PATENT DOCUMENTS

CN 101783366 A 7/2010
JP 2003-209122 7/2003
(Continued)

OTHER PUBLICATIONS

Written Opinion of the ISA/KR, International Application No. PCT/US2012/051711, dated Mar. 29, 2013, five (5) pages.
(Continued)

*Primary Examiner* — Maliheh Malek

(74) *Attorney, Agent, or Firm* — TraskBritt

(57) ABSTRACT

A semiconductor device structure is disclosed. The semiconductor device structure includes a mesa extending above a substrate. The mesa has a channel region between a first side and second side of the mesa. A first gate is on a first side of the mesa, the first gate comprising a first gate insulator and a first gate conductor comprising graphene overlying the first gate insulator. The gate conductor may comprise graphene in one or more monolayers. Also disclosed are a method for fabricating the semiconductor device structure; an array of vertical transistor devices, including semiconductor devices having the structure disclosed; and a method for fabricating the array of vertical transistor devices.

21 Claims, 4 Drawing Sheets

Related U.S. Application Data continuation of application No. 15/167,765, filed on May 27, 2016, now Pat. No. 10,002,935, which is a continuation of application No. 14/629,555, filed on Feb. 24, 2015, now Pat. No. 9,356,155, which is a division of application No. 13/215,968, filed on Aug. 23, 2011, now Pat. No. 8,969,154.

(51) Int. Cl.
| | | |
|---|---|---|
| *H01L 27/105* | (2006.01) | |
| *B82Y 10/00* | (2011.01) | |
| *H01L 29/786* | (2006.01) | |
| *H01L 29/49* | (2006.01) | |
| *H01L 29/78* | (2006.01) | |
| *H01L 21/8234* | (2006.01) | |
| *H01L 27/12* | (2006.01) | |
| *H01L 29/24* | (2006.01) | |
| *H01L 29/40* | (2006.01) | |
| *H01L 29/423* | (2006.01) | |

(52) U.S. Cl.
CPC .... *H01L 21/823487* (2013.01); *H01L 27/105* (2013.01); *H01L 27/1225* (2013.01); *H01L 29/24* (2013.01); *H01L 29/401* (2013.01); *H01L 29/42392* (2013.01); *H01L 29/49* (2013.01); *H01L 29/4908* (2013.01); *H01L 29/66666* (2013.01); *H01L 29/66795* (2013.01); *H01L 29/66969* (2013.01); *H01L 29/785* (2013.01); *H01L 29/7827* (2013.01); *H01L 29/7855* (2013.01); *H01L 29/78642* (2013.01); *H01L 29/78648* (2013.01); *H01L 29/78696* (2013.01); *H01L 27/1052* (2013.01); *H01L 29/42372* (2013.01)

(58) Field of Classification Search
CPC ......... H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/7855–7856; H01L 29/7853–7854

See application file for complete search history.

(56) References Cited

U.S. PATENT DOCUMENTS

| | | | |
|---|---|---|---|
| 5,107,321 A | | 4/1992 | Ilderem et al. |
| 5,308,778 A | | 5/1994 | Fitch et al. |
| 5,460,988 A | | 10/1995 | Hong |
| 5,468,661 A | * | 11/1995 | Yuan ................. H01L 29/66454 257/E21.406 |
| 5,578,513 A | * | 11/1996 | Maegawa ............ H01L 27/088 257/E21.412 |
| 5,824,577 A | | 10/1998 | Luich |
| 5,899,735 A | | 5/1999 | Tseng |
| 5,907,170 A | * | 5/1999 | Forbes .............. H01L 27/10864 257/296 |
| 5,994,735 A | | 11/1999 | Maeda et al. |
| 6,165,826 A | | 12/2000 | Chau et al. |
| 6,218,276 B1 | | 4/2001 | Liu et al. |
| 6,235,559 B1 | * | 5/2001 | Kuo ................. H01L 21/28008 438/149 |
| 6,300,198 B1 | | 10/2001 | Aeugle et al. |
| 6,406,962 B1 | * | 6/2002 | Agnello ................ H01L 21/84 257/E21.703 |
| 6,869,581 B2 | | 3/2005 | Kishi et al. |
| 6,940,113 B2 | | 9/2005 | Hsu et al. |
| 7,015,142 B2 | | 3/2006 | Deheer et al. |
| 7,071,258 B1 | | 7/2006 | Jang et al. |
| 7,276,416 B2 | | 10/2007 | Ramaswamy et al. |
| 7,381,608 B2 | * | 6/2008 | Brask ................ H01L 21/28079 257/E21.202 |
| 7,432,557 B1 | * | 10/2008 | Buynoski .......... H01L 29/42384 257/365 |
| 7,501,674 B2 | * | 3/2009 | Lee ................. H01L 21/823431 257/288 |
| 7,518,182 B2 | | 4/2009 | Abbott et al. |
| 7,528,025 B2 | * | 5/2009 | Brask .................... H01L 21/845 438/183 |
| 7,531,437 B2 | * | 5/2009 | Brask .................... H01L 21/845 257/E21.444 |
| 7,732,859 B2 | | 6/2010 | Anderson et al. |
| 7,745,290 B2 | * | 6/2010 | Seo ................... H01L 29/66795 257/E21.41 |
| 7,767,525 B2 | | 8/2010 | Manning et al. |
| 7,863,136 B2 | * | 1/2011 | Goldbach ............. H01L 29/785 257/328 |
| 7,892,945 B2 | * | 2/2011 | Bedell .................... B82Y 10/00 438/445 |
| 7,952,088 B2 | * | 5/2011 | Anderson ........... H01L 29/1606 257/24 |
| 8,076,717 B2 | * | 12/2011 | Sandhu .............. H01L 29/7827 257/296 |
| 8,101,474 B2 | * | 1/2012 | Zhu ................... H01L 21/28255 257/216 |
| 8,106,383 B2 | * | 1/2012 | Jenkins ............. H01L 29/78684 257/24 |
| 8,120,073 B2 | * | 2/2012 | Rakshit ................. H01L 29/785 257/288 |
| 8,124,465 B2 | * | 2/2012 | Yagishita .......... H01L 29/66636 257/E21.409 |
| 8,274,106 B2 | * | 9/2012 | Abbott ............. H01L 21/28132 257/302 |
| 8,274,110 B2 | * | 9/2012 | Sandhu ............... H01L 27/2463 257/329 |
| 8,330,156 B2 | | 12/2012 | Yamazaki et al. |
| 8,344,358 B2 | * | 1/2013 | Avouris ............. H01L 29/1606 257/24 |
| 8,431,486 B2 | * | 4/2013 | Cabral, Jr. ........ H01L 21/31116 257/E21.582 |
| 8,507,840 B2 | * | 8/2013 | Yu ..................... H01L 27/14607 250/214 R |
| 8,524,560 B2 | * | 9/2013 | Kim ................... H01L 27/108 438/268 |
| 8,546,198 B2 | * | 10/2013 | Ryu ........................ H01L 29/45 257/E21.41 |
| 8,723,252 B2 | * | 5/2014 | Sandhu ............... H01L 27/2463 257/329 |
| 8,878,298 B2 | * | 11/2014 | Chang ................. H01L 29/7856 257/350 |
| 8,969,154 B2 | | 3/2015 | Sandhu |
| 2003/0211695 A1 | * | 11/2003 | Chang .................... H01L 27/112 438/276 |
| 2004/0026734 A1 | | 2/2004 | Clevenger et al. |
| 2004/0032553 A1 | * | 2/2004 | Hong .................... G02F 1/1345 349/113 |
| 2004/0053431 A1 | * | 3/2004 | Chang ................... H01L 27/1214 438/30 |
| 2004/0108545 A1 | * | 6/2004 | Ando ................ H01L 21/26586 257/329 |
| 2004/0185683 A1 | | 9/2004 | Nakamura |
| 2005/0019993 A1 | * | 1/2005 | Lee ................... H01L 29/42384 438/157 |
| 2005/0077553 A1 | * | 4/2005 | Kim ................... H01L 21/823412 257/288 |
| 2005/0156171 A1 | * | 7/2005 | Brask ............... H01L 21/823821 257/72 |
| 2006/0017088 A1 | * | 1/2006 | Abbott ............. H01L 21/28132 257/302 |
| 2006/0046395 A1 | | 3/2006 | Ramaswamy et al. |
| 2006/0099750 A1 | | 5/2006 | Deheer et al. |
| 2006/0249779 A1 | * | 11/2006 | Choi ................... H01L 27/115 257/315 |
| 2006/0278915 A1 | * | 12/2006 | Lee ................... H01L 29/42328 257/315 |

(56) References Cited

U.S. PATENT DOCUMENTS

| | | | |
|---|---|---|---|
| 2007/0001219 A1* | 1/2007 | Radosavljevic | H01L 29/41791 257/327 |
| 2007/0023839 A1* | 2/2007 | Furukawa | B82Y 10/00 257/353 |
| 2007/0054448 A1* | 3/2007 | Choi | H01L 29/42328 438/201 |
| 2007/0057335 A1* | 3/2007 | Tsuchiya | H01L 21/28097 257/412 |
| 2007/0069293 A1* | 3/2007 | Kavalieros | H01L 21/823431 257/350 |
| 2007/0075351 A1* | 4/2007 | Schulz | H01L 21/823857 257/314 |
| 2007/0187682 A1* | 8/2007 | Takeuchi | H01L 21/823807 257/64 |
| 2007/0194373 A1* | 8/2007 | Anderson | H01L 21/823807 257/330 |
| 2007/0221956 A1* | 9/2007 | Inaba | H01L 21/823807 257/197 |
| 2007/0235819 A1* | 10/2007 | Yagishita | H01L 29/66636 257/401 |
| 2007/0246765 A1* | 10/2007 | Bach | H01L 27/115 257/314 |
| 2007/0295995 A1* | 12/2007 | Yun | H01L 27/10885 257/202 |
| 2008/0049486 A1 | 2/2008 | Gruening-Von Schwerin | |
| 2008/0099814 A1 | 5/2008 | Gruening-Von et al. | |
| 2008/0135888 A1* | 6/2008 | Lee | H01L 29/045 257/255 |
| 2008/0258140 A1* | 10/2008 | Lee | H01L 21/02554 257/43 |
| 2008/0315282 A1* | 12/2008 | Cho | H01L 23/485 257/315 |
| 2009/0020764 A1 | 1/2009 | Anderson et al. | |
| 2009/0039448 A1* | 2/2009 | Chuang | G02F 1/133345 257/411 |
| 2009/0047749 A1* | 2/2009 | Lin | H01L 27/1214 438/29 |
| 2009/0065852 A1* | 3/2009 | Lin | H01L 29/0673 257/326 |
| 2009/0085157 A1* | 4/2009 | Muemmler | H01L 27/0207 257/532 |
| 2009/0146208 A1* | 6/2009 | Ban | H01L 21/84 257/326 |
| 2009/0181502 A1 | 7/2009 | Parikh et al. | |
| 2009/0195939 A1* | 8/2009 | Gurney | G11B 5/374 360/314 |
| 2009/0224230 A1* | 9/2009 | Pesetski | B82Y 10/00 257/24 |
| 2009/0224357 A1* | 9/2009 | Juengling | H01L 29/66545 257/506 |
| 2009/0283744 A1* | 11/2009 | Jiang | H01L 29/458 257/9 |
| 2010/0025660 A1* | 2/2010 | Jain | H01L 29/66977 257/24 |
| 2010/0052027 A1 | 3/2010 | Abbott et al. | |
| 2010/0055388 A1* | 3/2010 | Chen | H01L 29/1606 428/119 |
| 2010/0065844 A1* | 3/2010 | Tokunaga | H01L 29/78606 257/43 |
| 2010/0072468 A1* | 3/2010 | Yamazaki | H01L 29/66969 257/43 |
| 2010/0078711 A1* | 4/2010 | Goldbach | H01L 29/66795 257/329 |
| 2010/0096680 A1* | 4/2010 | Mouli | B82Y 10/00 257/296 |
| 2010/0102292 A1 | 4/2010 | Hiura et al. | |
| 2010/0105163 A1* | 4/2010 | Ito | H01L 27/1214 438/104 |
| 2010/0109032 A1* | 5/2010 | Jeong | H01L 33/62 257/94 |
| 2010/0123132 A1* | 5/2010 | Nakata | H01L 29/7869 257/43 |
| 2010/0155710 A1* | 6/2010 | Lee | H01L 51/0005 257/40 |
| 2010/0155843 A1* | 6/2010 | Mayer | H01L 29/41791 257/347 |
| 2010/0184261 A1* | 7/2010 | Yagishita | H01L 29/66636 438/157 |
| 2010/0200840 A1* | 8/2010 | Anderson | H01L 29/1606 257/29 |
| 2010/0213435 A1 | 8/2010 | Fujii et al. | |
| 2010/0213458 A1* | 8/2010 | Prall | H01L 29/66825 257/43 |
| 2010/0237336 A1 | 9/2010 | Rinzler et al. | |
| 2010/0258787 A1 | 10/2010 | Chae et al. | |
| 2010/0258852 A1* | 10/2010 | Lim | H01L 27/11551 257/324 |
| 2010/0270512 A1 | 10/2010 | Okai et al. | |
| 2010/0295119 A1* | 11/2010 | Sandhu | H01L 29/7827 257/329 |
| 2010/0295120 A1* | 11/2010 | Sandhu | H01L 27/2454 257/329 |
| 2011/0006425 A1 | 1/2011 | Wada et al. | |
| 2011/0037124 A1* | 2/2011 | Liu | B82Y 10/00 257/348 |
| 2011/0041980 A1 | 2/2011 | Kim et al. | |
| 2011/0045202 A1 | 2/2011 | Sandhu | |
| 2011/0068407 A1* | 3/2011 | Yeh | H01L 21/823807 257/369 |
| 2011/0079836 A1* | 4/2011 | Lin | H01L 27/10826 257/306 |
| 2011/0089403 A1* | 4/2011 | Woo | B82Y 10/00 257/29 |
| 2011/0089450 A1* | 4/2011 | Jeong | H01L 33/145 257/98 |
| 2011/0101456 A1* | 5/2011 | Hoentschel | H01L 29/045 257/347 |
| 2011/0114919 A1* | 5/2011 | Jenkins | H01L 29/78684 257/29 |
| 2011/0114971 A1* | 5/2011 | Sato | H01L 27/1218 257/88 |
| 2011/0123776 A1 | 5/2011 | Shin et al. | |
| 2011/0147856 A1* | 6/2011 | Sasaki | H01L 29/66795 257/401 |
| 2011/0163390 A1* | 7/2011 | Sandhu | H01L 27/1021 257/401 |
| 2011/0175163 A1* | 7/2011 | Cartier | H01L 29/66795 257/347 |
| 2011/0193141 A1* | 8/2011 | Lin | H01L 29/045 257/255 |
| 2011/0206934 A1* | 8/2011 | Bol | B82Y 30/00 428/408 |
| 2011/0210362 A1* | 9/2011 | Lee | H01L 33/382 257/98 |
| 2011/0210395 A1* | 9/2011 | Orlowski | H01L 29/41791 257/347 |
| 2011/0220865 A1* | 9/2011 | Miyata | B82Y 10/00 257/12 |
| 2011/0220875 A1* | 9/2011 | Jang | B82Y 10/00 257/24 |
| 2011/0244639 A1* | 10/2011 | Ogawa | G03F 7/0757 438/197 |
| 2011/0253983 A1* | 10/2011 | Chen | H01L 29/1606 257/27 |
| 2011/0291192 A1* | 12/2011 | Pillarisetty | H01L 29/66545 257/347 |
| 2011/0291196 A1* | 12/2011 | Wei | H01L 29/66795 257/365 |
| 2011/0298041 A1* | 12/2011 | Renn | H01L 27/10826 257/330 |
| 2011/0298053 A1* | 12/2011 | Zhong | H01L 21/28176 257/368 |
| 2012/0001167 A1* | 1/2012 | Morosawa | H01L 29/7869 257/43 |
| 2012/0025312 A1* | 2/2012 | Scheiper | H01L 21/82380 257/347 |
| 2012/0032227 A1* | 2/2012 | Seabaugh | H01L 29/7391 257/105 |

(56) References Cited

U.S. PATENT DOCUMENTS

| | | | |
|---|---|---|---|
| 2012/0049160 A1* | 3/2012 | Sano | H01L 21/8213 257/27 |
| 2012/0052640 A1* | 3/2012 | Fischer | H01L 21/823425 438/268 |
| 2012/0074387 A1* | 3/2012 | King | H01L 21/02381 257/29 |
| 2012/0074399 A1* | 3/2012 | Den Boer | H01L 29/78603 257/43 |
| 2012/0094453 A1* | 4/2012 | Han | H01L 27/11582 438/269 |
| 2012/0138922 A1* | 6/2012 | Yamazaki | H01L 29/1033 257/43 |
| 2012/0145998 A1* | 6/2012 | Chen | B82Y 10/00 257/24 |
| 2012/0168723 A1* | 7/2012 | Park | H01L 21/0237 257/29 |
| 2012/0181506 A1* | 7/2012 | Farmer | H01L 29/1606 257/29 |
| 2012/0181532 A1* | 7/2012 | Lin | H01L 29/7869 257/43 |
| 2012/0187475 A1* | 7/2012 | Yamazaki | H01L 21/84 257/330 |
| 2012/0205686 A1* | 8/2012 | Seo | H01L 51/5221 257/89 |
| 2012/0205719 A1* | 8/2012 | Juengling | H01L 21/823431 257/204 |
| 2012/0206012 A1* | 8/2012 | Rosenblatt | B81C 1/00142 310/300 |
| 2012/0220053 A1* | 8/2012 | Lee | H01L 29/4908 436/501 |
| 2012/0220102 A1* | 8/2012 | Or-Bach | H01L 21/76254 438/458 |
| 2012/0241739 A1* | 9/2012 | Yamazaki | H01L 27/0688 257/43 |
| 2012/0248399 A1* | 10/2012 | Sasago | H01L 27/2409 257/4 |
| 2012/0248414 A1* | 10/2012 | Kim | B82Y 10/00 257/29 |
| 2012/0256272 A1* | 10/2012 | Juengling | H01L 21/0337 257/390 |
| 2012/0258587 A1* | 10/2012 | Kub | B82Y 30/00 438/610 |
| 2012/0261643 A1* | 10/2012 | Cohen | B82Y 10/00 257/27 |
| 2012/0264272 A1* | 10/2012 | Sills | H01L 45/04 438/381 |
| 2012/0267624 A1* | 10/2012 | Isobe | H01L 27/0688 257/43 |
| 2012/0281484 A1* | 11/2012 | Cho | G11C 16/0416 365/185.28 |
| 2012/0292715 A1* | 11/2012 | Hong | H01L 21/28008 257/392 |
| 2012/0313153 A1* | 12/2012 | Zhang | H01L 29/665 257/288 |
| 2012/0313170 A1* | 12/2012 | Chang | H01L 29/66545 257/347 |
| 2012/0315732 A1* | 12/2012 | Kang | H01L 21/845 438/197 |
| 2013/0002312 A1* | 1/2013 | Yamazaki | H01L 27/0266 327/109 |
| 2013/0005081 A1* | 1/2013 | Chen | H01L 29/78606 438/104 |
| 2013/0005102 A1* | 1/2013 | Juengling | H01L 27/105 438/270 |
| 2013/0028016 A1* | 1/2013 | Sandhu | H01L 29/40114 365/184 |
| 2013/0029460 A1* | 1/2013 | Sandhu | H01L 21/768 438/131 |
| 2013/0122668 A1* | 5/2013 | Anderson | H01L 29/66795 438/164 |
| 2013/0122672 A1* | 5/2013 | Or-Bach | H01L 21/76254 438/199 |
| 2013/0140627 A1* | 6/2013 | Masuoka | H01L 29/7827 257/329 |
| 2013/0143374 A1* | 6/2013 | Hayashi | H01L 29/78687 438/197 |
| 2013/0164894 A1* | 6/2013 | Kim | H01L 27/11551 438/269 |
| 2013/0171788 A1* | 7/2013 | Yang | H01L 29/7827 438/268 |
| 2013/0186860 A1* | 7/2013 | Kub | B82Y 30/00 216/81 |
| 2013/0189444 A1* | 7/2013 | Kub | B82Y 30/00 427/523 |
| 2013/0230958 A1* | 9/2013 | Lee | H01L 21/823431 438/283 |
| 2013/0264630 A1* | 10/2013 | Kim | H01L 29/7926 257/321 |
| 2013/0270639 A1* | 10/2013 | Lee | H01L 29/41791 257/347 |
| 2013/0306967 A1* | 11/2013 | Hoentschel | H01L 21/845 257/48 |
| 2014/0015015 A1* | 1/2014 | Krivokapic | H01L 21/02527 257/288 |
| 2014/0061650 A1* | 3/2014 | Tessler | B82Y 10/00 257/57 |
| 2014/0087191 A1* | 3/2014 | Chua | H01L 21/2007 428/408 |
| 2014/0124729 A1* | 5/2014 | Hwang | H01L 45/1608 257/5 |
| 2014/0131703 A1* | 5/2014 | Miyamoto | H01L 27/127 257/43 |
| 2014/0225066 A1* | 8/2014 | Weber | H01L 21/0485 257/29 |
| 2014/0225068 A1* | 8/2014 | Chung | H01L 29/42384 257/29 |
| 2015/0129934 A1* | 5/2015 | Xie | H01L 27/0886 257/192 |
| 2015/0162448 A1* | 6/2015 | Raghavan | H01L 29/7869 257/43 |
| 2015/0236164 A1 | 8/2015 | Sandhu | |
| 2016/0276454 A1 | 9/2016 | Sandhu | |
| 2017/0062593 A1* | 3/2017 | Ranade | H01L 21/28255 |
| 2017/0221032 A1* | 8/2017 | Mazed | G06N 3/08 |
| 2017/0222057 A1* | 8/2017 | Yamazaki | H01L 29/42384 |
| 2019/0067375 A1* | 2/2019 | Karda | H01L 29/78696 |

FOREIGN PATENT DOCUMENTS

| | | |
|---|---|---|
| JP | 2010-212619 A | 9/2010 |
| JP | 2012-516560 | 7/2012 |
| JP | 2013-511139 | 3/2013 |
| WO | 2005/079182 A2 | 9/2005 |
| WO | 2008/108383 A1 | 9/2008 |
| WO | 2010/135172 A1 | 11/2010 |
| WO | 2011/074987 A1 | 6/2011 |

OTHER PUBLICATIONS

Suresh et al., "High Performance Transparent Thin Film Transistors Based on Indium Gallium Zinc Oxide as the Channel Material," 2007 IEEE Int'l Electron Devices Meeting, (Dec. 10-12, 2007), pp. 587-590.
Supplementary European Search Report for European Application No. EP12825988 completed Jun. 24, 2015, 11 pages.
Supplemental European Search Report for European Application No. EP12825988, Completed Feb. 25, 2015, 4 pages.
Suganuma et al., "Fabrication of Transparent and Flexible Organic Field-Effect Transistors with Solution-Processed Graphene Soure-Drain and Gate Electrodes," Applied Physics Express, vol. 4, (Jan. 19, 2011), pp. 021603-1-021603-3.
Second Office Action for Chinese Application No. 201280041260.2, (dated Aug. 1, 2016), 5 pages with English Translation.
Office Action of Korean Patent Application No. 10-2014-7003763, (dated Mar. 13, 2015), 7 pages (including translation).
Notice of Rejection for Japanese Application No. 2014-527242, dated Feb. 10, 2015, 4 pages (with annotatedly-added boxes indicating portions translated).

(56) References Cited

OTHER PUBLICATIONS

Kim et al., "A Role for Graphene in Silicon-Based Semiconductor Devices," Nature, vol. 479, (Nov. 17, 2011), pp. 338-344.
Japanese Office Action for Japanese Application No. 2014-527242, (dated Aug. 4, 2015), 2 pages, (with annotatedly-added boxes indicating portions translated).
International Search Report of the ISA/KR, International Application No. PCT/US2012/051711, dated Mar. 29, 2013, three (3) pages.
International Preliminary Report on Patentability for International Application No. PCT/US2012/051711, (dated Feb. 25, 2014), 6 pages.
Chinese Office Action for Chinese Application No. 2012800412602, (dated Nov. 23, 2015), 15 pages (including translation).

* cited by examiner

SEMICONDUCTOR DEVICES COMPRISING CHANNEL MATERIALS

CROSS-REFERENCE TO RELATED APPLICATIONS

This application is a continuation of U.S. patent application Ser. No. 16/004,908, filed Jun. 11, 2018, issued, now U.S. Pat. No. 10,446,692, which is a continuation of U.S. patent application Ser. No. 15/167,765, filed May 27, 2016, now U.S. Pat. No. 10,002,935, issued Jun. 19, 2018, which is a continuation of U.S. patent application Ser. No. 14/629,555, filed Feb. 24, 2015, now U.S. Pat. No. 9,356,155, issued May 31, 2016, which is a divisional of U.S. patent application Ser. No. 13/215,968, filed Aug. 23, 2011, now U.S. Pat. No. 8,969,154, issued Mar. 3, 2015, the disclosure of each of which is hereby incorporated herein in its entirety by this reference.

TECHNICAL FIELD

The invention, in various embodiments, relates generally to the field of integrated circuit design and fabrication. More particularly, this disclosure relates to vertically-oriented transistors and methods for fabricating the transistors.

BACKGROUND

Fabricating a semiconductor device, such as a transistor, upon a substrate necessarily leads to occupation of a certain surface area of the substrate by the footprint of the device. Often, the available surface area of a given substrate is limited, and maximizing the use of the substrate requires maximizing the density of devices fabricated on the substrate. Minimizing the dimensions of components of a device, such as a transistor, accommodates minimizing the overall footprint of the device and maximizing of the device density. This accommodates formation of a greater number of devices on a given substrate.

Transistors are often constructed upon the primary surface of the substrate. The primary surface is generally the uppermost, exterior surface of the substrate. The primary surface of the substrate is considered to define a horizontal plane and direction.

Field effect transistor ("FET") structures, which include a channel region between a pair of source/drain regions and a gate configured to electrically connect the source/drain regions to one another through the channel region, can be divided amongst two broad categories based on the orientations of the channel regions relative to the primary surface of the substrate. Transistor structures that have channel regions that are primarily parallel to the primary surface of the substrate are referred to as planar FET structures, and those having channel regions that are generally perpendicular to the primary surface of the substrate are referred to as vertical FET ("VFET") transistor structures. Because current flow between the source and drain regions of a transistor device occurs through the channel region, planar FET devices can be distinguished from VFET devices based upon both the direction of current flow as well as on the general orientation of the channel region. VFET devices are devices in which the current flow between the source and drain regions of the device is primarily substantially orthogonal to the primary surface of the substrate. Planar FET devices are devices in which the current flow between source and drain regions is primarily parallel to the primary surface of the substrate.

A VFET device includes a vertical, so-called "mesa," also referred to in the art as a so-called "fin," that extends upward from the underlying substrate. This mesa forms part of the transistor body. Generally, a source region and a drain region are located at the ends of the mesa while one or more gates are located on one or more surfaces of the mesa or fin. Upon activation, current flows through the channel region within the mesa.

VFETs are generally thinner in width (i.e., in the dimension in a plane parallel to the horizontal plane defined by the primary surface of the substrate) than planar FETs. Therefore, vertical transistors are conducive to accommodating increased device packing density and are conducive for inclusion within a cross-point memory array. In such an array, multiple VFETs are ordered in stacked rows and columns. However, even with this arrangement, the packing density is at least partially limited by the minimal dimensions of the components of the vertical transistor, including the gate and channel components.

Scaling or otherwise reducing the dimensions of transistor components depends, at least in part, on the limitations of conventional semiconductor fabrication techniques, physical limitations of materials used in the fabrication, and minimal properties required for fabricating an operational device. For example, to form a typical gate metal having the properties to achieve the necessary level of low electrical resistance, a gate thickness of greater than 5 nanometers is generally required. Using a gate metal of 5 nm thickness in a VFET device having a surround gate, the total width of the device must take into account twice the width of the gate material. Therefore, a typical VFET surround gate will have at least 10 nanometers of the VFET device's width consumed by the gate conductor.

DETAILED DESCRIPTION

Figure 1:
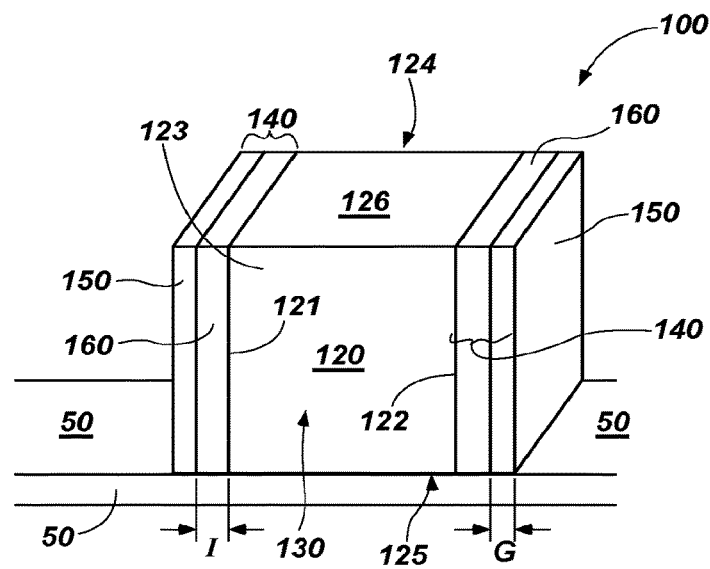
FIG. 1 is a cross-sectional, top and front perspective, schematic view of a vertical field effect transistor of an embodiment of the present disclosure.

A semiconductor device structure, an array of vertical transistor devices, and methods for fabricating such structures or devices are disclosed. The vertical transistor device and array of VFETs all include thin gate conductors, making the present VFET structure and method conducive in high-device-density integrated circuit designs, including cross-point memory arrays.

As used herein, the term "substrate" means and includes a base material or construction upon which materials, such as vertical field effect transistors, are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium ($Si_{1-x}Ge_x$), germanium (Ge), gallium arsenide (GaAs), gallium nitride (GaN), or indium phosphide (InP). Furthermore, when reference is made to a "wafer" or "substrate" in the following description, previous process steps may have been utilized to form regions or junctions in the base semiconductor structure or foundation.

As used herein, the term "graphene" means and includes a poly-cyclic aromatic molecule having a plurality of carbon atoms that are connected to each other by covalent bonds. The plurality of carbon atoms may form a plurality of six-member rings, which function as a standard repeating unit, and may further include a five-membered ring and/or a seven-membered ring. The graphene may be a one atom thick material of the six-member rings in which the carbon atoms are covalently bonded and have $sp^2$ hybridization. The graphene may include the monolayer of graphene. Alternatively, the graphene may include multiple monolayers of graphene stacked upon one another. In this regard, the graphene may have a maximum thickness of about 5 nanometers. If multiple monolayers of graphene are used, the graphene may be used as a gate in a semiconductor device structure. If a one atom thick material is used, the graphene may be used as a switchable material.

As used herein, while the terms "first," "second," "third," etc., may describe various elements, components, regions, layers, and/or sections, none of which are limited by these terms. These terms are used only to distinguish one element, component, region, material, layer, or section from another element, component, region, material, layer, or section. Thus, "a first element," "a first component," "a first region," "a first material," "a first layer," or "afirst section" discussed below could be termed a second element, a second component, a second region, a second material, a second layer, or second section without departing from the teachings herein.

As used herein, spatially relative terms, such as "beneath," "below," "lower," "bottom," "above," "upper," "top," "front," "rear," "left," "right," and the like, may be used for ease of description to describe one element or feature's relationship to another element(s) or feature(s) as illustrated in the figures. Unless otherwise specified, the spatially relative terms are intended to encompass different orientations of the device in use or operation in addition to the orientation depicted in the figures. For example, if a device in the figures is turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The device may be otherwise oriented (rotated 90 degrees or at other orientations) and the spatially relative descriptors used herein interpreted accordingly.

As used herein, reference to an element as being "on" another element means and includes the element being directly on top of adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, steps, operations, elements, and/or components, but do not preclude the presence or addition of one or more other features, regions, integers, steps, operations, elements, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Example embodiments are described herein with reference to cross-sectional illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes or regions as illustrated but are to include deviations in shapes that result, for example, from manufacturing. For example, a region illustrated or described as box shaped may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The following description provides specific details, such as material types, material thicknesses, and processing conditions in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, and physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, abrasive planarization, or other known material-removal methods.

Reference will now be made to the drawings, where like numerals refer to like components throughout. The drawings are not necessarily drawn to scale.

FIG. 1 is a cross-sectional, front and top perspective view of a schematic of a VFET device 100 (e.g., a semiconductor device) having a structure of the present disclosure. The VFET device 100 includes a mesa 120 extending above a substrate 50 such that a bottom side 125 of the mesa 120 sits on a horizontally planar upper surface of the substrate 50. The mesa 120 extends above the substrate 50 in a direction perpendicular to the substrate 50. The mesa 120 has a first side 121 and a second side 122 that is opposite and substantially parallel to the first side 121. A channel region 130 passes through the mesa 120 between the first side 121 and the second side 122. In use and operation, the channel region 130 is configured to allow current to flow between a source region (not shown) and a drain region (not shown). A top side 126 of the mesa 120 may be in operable communication with an electrode (not shown) or interconnect (not shown).

A first gate 140 is provided on the first side 121 of the mesa 120. The first gate 140 is operative to control current flow in the channel region 130. A second gate 140 may be provided on the second side 122 of the mesa 120, as well, the second gate 140 being operative to control, in conjunction with the first gate 140, current flow in the channel region 130 of the mesa 120.

Each gate 140 includes a gate insulator 160 and an overlying gate conductor 150. The gate insulator 160 may be provided directly on the first and/or second sides 121, 122 of the mesa 120. The gate conductor 150 may be provided directly on the gate insulator 160 and may surround the vertical sides of the mesa 120, i.e., may surround the first side 121, the second side 122, a third side 123, and a fourth side 124 of the mesa 120. In such embodiments, the third side 123 and fourth side 124 may be opposite and parallel one another and arranged perpendicularly to the first side 121 and the second side 122.

In other embodiments of the present VFET device 100, the gate 140 is provided only on the first side 121 of the mesa 120. In still other embodiments, the gate 140 is provided only on the first side 121 and second side 122 of the mesa 120, but not on the third side 123 or the fourth side 124.

According to the embodiment of the present VFET device 100 depicted in FIG. 1, the gate conductor 150 of the sidewall gate 140 substantially overlies the entire exterior surface of the gate insulator 160 (i.e., the surface of the gate insulator 160 that is opposite and substantially parallel to the surface of the gate insulator 160 that is proximate to the mesa 120). In other embodiments of the VFET device 100, the gate conductor 150 of the gate 140 overlies only a portion of the exterior surface of the gate insulator 160. In some such embodiments, the gate conductor 150 is structured as a ring-gate conductor.

Figure 11:
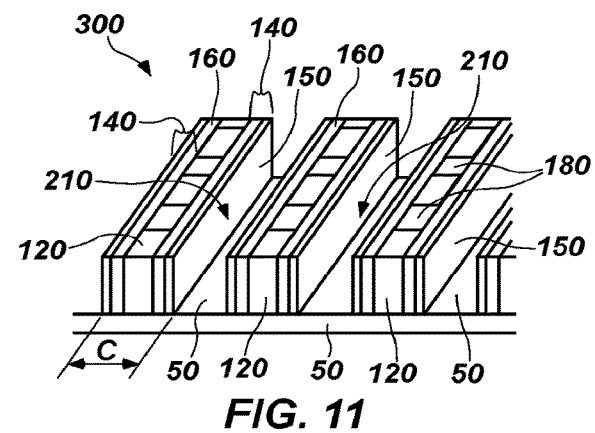
Figure 21:
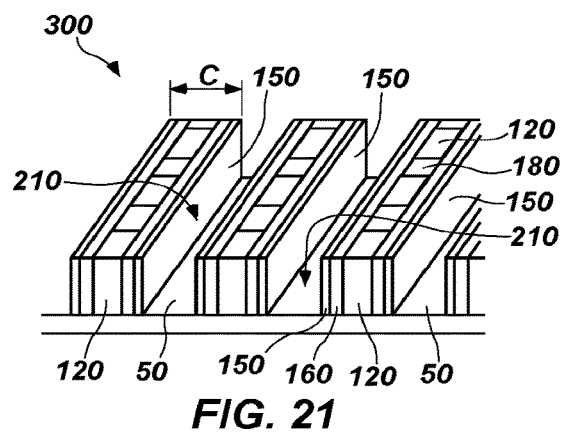

The gate conductor 150 of the present VFET device 100 is a gate conductor, defining a gate conductor thickness G (i.e., the dimension of the shortest side of the gate conductor 150, when such gate conductor 150 is construed as having a three-dimensional box shape) of less than or equal to about 5 nanometers. Therefore, according to the depicted VFET device 100 having a pair of gates 140, the thickness of the gate conductor 150 contributes twice the thickness G of the gate conductor 150 to the overall width C of one formed VFET cell (FIG. 11 and FIG. 21). The thickness G of the gate conductor 150 may be less than the thickness I of the gate insulator 160, which is defined by the dimension of the shortest side of the gate insulator 160, when such gate insulator 160 is construed as having a three-dimensional box shape.

The gate conductor 150 may be formed from graphene, or at least a portion of the gate conductor 150 may include graphene. Graphene exhibits high electrical conductivity and has a single atom body thickness. Therefore, graphene possesses great potential for high-speed electronics. Generally, graphene is a one-atom thick planar sheet of $sp^2$-bonded carbon atoms that are densely packed in a honeycomb lattice such that the carbon atoms of graphene sheets are connected to each other in an extended array of hexagonal rings. Individual graphene sheets may be stacked. Therefore, the gate conductor 150 may include a plurality of layers of graphene. If multiple monolayers of graphene are used, the graphene may be used as the gate conductor 150. If a one atom thick material is used, the graphene may be used as a switchable material in the semiconductor device.

A semiconductor device structure including the vertical transistor devices comprises a mesa extending above a substrate and a first gate on the first side of the mesa is disclosed. The mesa comprises a channel region between a first side and a second side of the mesa. The first gate comprises a first gate insulator and a first gate conductor comprising graphene overlying the first gate insulator.

Figure 2:
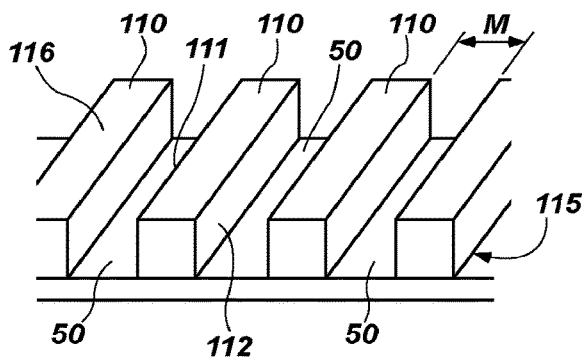
FIGS. 2-11 are cross-sectional, top and front perspective, schematic views of a semiconductor device structure during various stages of processing according to an embodiment of the present disclosure.

FIGS. 2-11 depict various stages of processing of a plurality of vertical transistors in accordance with embodiments of the present method for fabricating a semiconductor device, such as a VFET device 100, as well as for fabricating an array 300 (FIG. 10) of vertical transistor devices 100. With particular reference to FIG. 2, the present method includes forming a plurality of metal seeds 110 upon a substrate 50. The metal seeds 110 are spaced from one another and arranged in parallel. The metal seeds 110 may be formed at pitch. Each metal seed 110 includes a first side 111, second side 112, bottom side 115, and top side 116. According to the depiction in FIG. 2, the metal seeds 110 are positioned such that the bottom side 115 of each metal seed 110 is adjacent to the substrate 50, and the top side 116 of each metal seed 110 is opposite the bottom side 115 and directed upward from substrate 50. The first side 111 of one metal seed 110 is positioned opposite and parallel to the second side 112 of a neighboring metal seed 110. The metal seeds 110 may be evenly spaced from one another, arranged in parallel, such that each metal seed 110 is separated from each adjacent and parallel metal seed 110 by a trench having a width M equal to a first distance. In other embodiments, the metal seeds 110 may be spaced unevenly from one another such that one metal seed 110 is spaced further from a first neighboring metal seed 110 than it is spaced from a second neighboring metal seed 110. In still other embodiments, the metal seeds 110 may be spaced unevenly such that one metal seed 110 is spaced further from a neighboring metal seed 110 at a first end than it is spaced from the neighboring metal seed 110 at a second end.

The material of the metal seed 110 may be any metal conducive for forming a gate conductor 150, such as a gate conductor of graphene, thereupon. For example, without limitation, copper, nickel, iridium, ruthenium, combinations thereof, and solid mixtures containing any or all of these metals may be used as the material of the metal seed 110. As a more particular example, the metal seed 110 may be formed from copper, such as polycrystalline copper.

Figure 3:
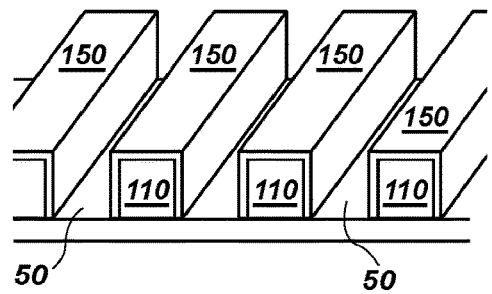

With reference to FIG. 3, the method for fabricating a semiconductor device, such as a VFET device 100, or array 300, further includes forming a conductor material upon each of the plurality of metal seeds 110 to form a gate conductor 150, including gate conductor sidewalls aligning each of the first sides 111 and second sides 112 of the metal seeds 110. The conductor material may be formed conformally over the first side 111, second side 112, and top side 116 of the metal seeds 110. The conductor material of the gate conductors 150 may be formed by any suitable technique, including, but not limited to, CVD, ALD, plasma-enhanced ALD, or other known methods. Portions of the conductor material overlying an upper surface of the substrate 50, if any, may be removed by conventional techniques, exposing the substrate 50.

The conductor material of the gate conductor 150 may be formed of graphene. Various methods of forming graphene are known. U.S. Pat. No. 7,071,258, which issued Jul. 4, 2006, to Jang et al.; U.S. Pat. No. 7,015,142, which issued Mar. 21, 2006, to DeHeer et al.; U.S. Pat. No. 6,869,581, which issued Mar. 22, 2005, to Kishi et al.; U.S. Patent Application Publication No. 2011/0123776, which published May 26, 2011, for Shin et al.; and U.S. Patent Application Publication No. 2006/0099750, which published May 11, 2006, for DeHeer et al. describe various methods of forming graphene. Any such suitable technique may be used to form the gate conductor 150 from graphene on the metal seeds 110. For example, without limitation, in some embodiments, graphene may be formed using ALD, CVD, or other known methods.

In such embodiments, the graphene may be formed directly upon the exterior surface of the metal seeds 110. According to the depiction of FIG. 3, the conductor material may overlay at least the first side 111, top side 116, and second side 112 of each metal seed 110 of the plurality of metal seeds 110, but may not overlay the upper surface of the substrate 50. Regardless of how formed, the gate conductor 150 formed from graphene may have a thickness of only one atom. Alternatively, the gate conductor 150 formed from graphene may include bi-, tri-, or other multi-layer graphene.

In other embodiments of the disclosed method, the conductor material may be formed so as to form the depicted gate conductor 150 sidewalls and topwall and to overlay the upper surface of the substrate 50. The semiconductor device may be thereafter suitably processed to remove the conductor material overlying the substrate 50, such as using photolithography, etching, or other known methods, to produce, at least, gate conductor 150 sidewalls overlying the first side 111 and second side 112 of each of the metal seeds 110, but not on the upper surface of the substrate 50 positioned between the metal seeds 110.

Figure 4:
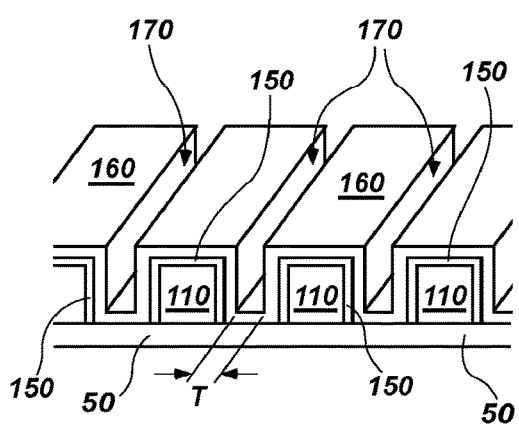

With reference to FIG. 4, the present method further includes forming an insulator material upon each of the plurality of gate conductor 150 sidewalls to form a plurality of gate insulator 160 sidewalls. The method may further include forming the insulator material upon a gate conductor 150 topwall or top side 116 of the metal seeds 110. The method may further include forming the insulator material upon a gate conductor 150 bottomwall positioned between the metal seeds 110 or upon an exposed substrate 50 surface positioned between the metal seeds 110. The insulator material may be conformally formed over the gate conductor 150 sidewalls and topwall and the remaining exposed substrate 50 surface. Thus, according to the depiction in FIG. 4, the insulator material is formed upon each of the gate conductor 150 sidewalls and topwall and the remaining exposed substrate 50 surface. Forming the insulator material upon the gate conductor 150 sidewalls may include forming a seed material directly upon the gate conductor 150 sidewalls before forming the insulator material upon the gate conductor 150 sidewalls. As such, the formed gate insulator 160 sidewalls may include both the seed material and the insulator material. As formed, a first gate insulator 160 sidewall of the plurality of gate insulator 160 sidewalls is separated from a second gate insulator 160 sidewall of the plurality by a first trench 170. Because the metal seeds 110 may be evenly spaced in parallel from one another, the formed gate insulator 160 sidewalls may be evenly spaced from one another, such that each first trench 170 defines a first trench width T. First trench width T is less than the first distance of width M (FIG. 2) separating the metal seeds 110. The first trench width T is equal to the width M decreased by twice the thickness of the insulator material of the first gate insulator 160 and twice the thickness of the conductor material of the first gate conductor 150.

The gate insulator 160 sidewalls, topwall, or bottomwall may be formed by any suitable technique, including, but not limited to, CVD, ALD, plasma-enhanced ALD, PVD, or other known methods. In one embodiment, the gate insulator 160 is formed by ALD. The insulator material of the gate insulator 160 may be any suitable insulative material. For example, without limitation, the gate insulator 160 may be formed from an oxide.

Figure 5:
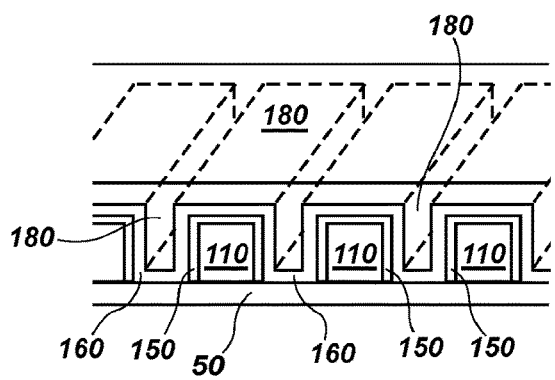

With reference to FIG. 5, the present method may further include filling the first trenches 170 with a second insulator material 180. The second insulator material 180 may not only fill the first trenches 170, but may also cover the gate insulator 160 topwall. Filling the first trenches 170 with the second insulator material 180 may be accomplished by any suitable method, including, without limitation, by spin coating, blanket coating, CVD, or other known methods. The second insulator material 180 may be formed from any suitable insulative material. For example, without limitation, the second gate insulator 160 may be formed from a conventional interlayer dielectric ("ILD") material, such as silicon oxide or silicon nitride.

In other embodiments of the disclosed method, filling the first trenches 170 with the second insulator material 180 may include filling only the first trenches 170 with the second insulator material 180, and not overlying the second insulator material 180 upon the top sides 116 of the metal seeds 110, the topwall of the gate conductor 150 material, or the topwall of the gate insulator 160 material.

Figure 6:
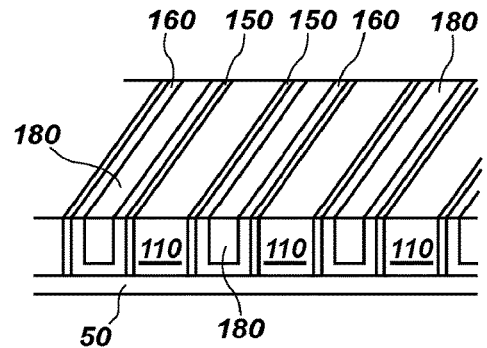

With reference to FIG. 6, the method may further include, if necessary, removing portions of the second insulator material 180, portions of the gate insulator 160 material, and portions of the gate conductor 150 material, to expose the top sides 116 of the metal seeds 110. This may be accomplished by any suitable method, including, without limitation, planarization methods such as abrasive planarization, chemical mechanical polishing or planarization ("CMP") or an etching process.

The method may further include removing the metal seeds 110 and filling the spaces once occupied by the metal seeds 110 with a material having a melting temperature greater than the melting temperature of the material forming the metal seeds 110. As such, the re-filled material may be configured to withstand, without substantial deformation, higher fabrication temperatures than the metal seeds 110 could withstand.

Figure 7:
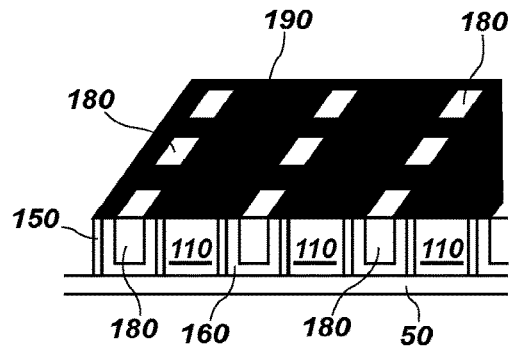
Figure 8:
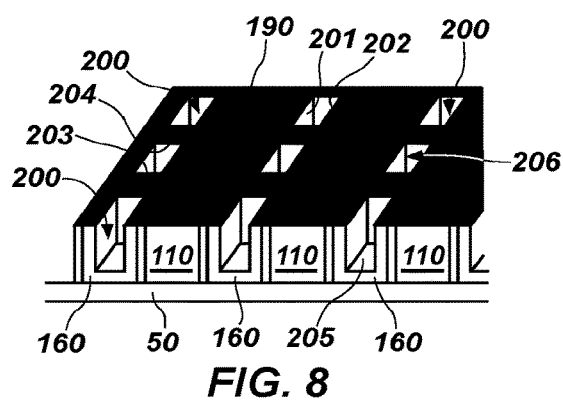
Figure 9:
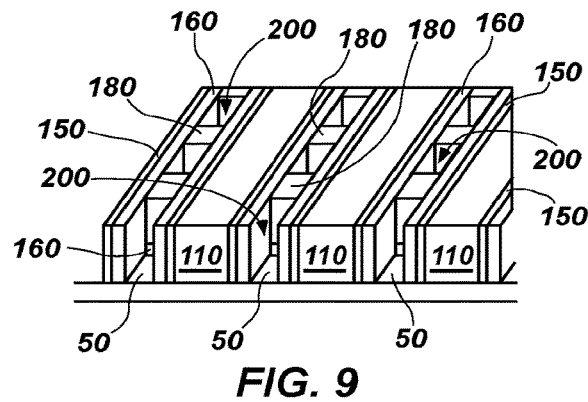

With reference to FIGS. 7 through 9, the method may further include selectively removing segments of the second insulator material 180 to expose underlying sections of the substrate 50. The removed segments of second insulator material 180 may be spaced segments. The removed segments define a plurality of cavities 200 in the second insulator material 180. The removal of the segments of second insulator material 180 may be accomplished by patterning in a direction orthogonal to the substrate 50, such as by use of a photomask 190 that leaves exposed the top surface of ordered segments of second insulator material 180. Etching or any other suitable method may be used to remove the segments of second insulator material 180 in accordance with the photomask 190 pattern, as depicted in FIG. 8, after which, the photomask 190 may be removed (FIG. 9).

According to the depicted method, each cavity 200 is formed in a three-dimensional box shape, such that a first side 201 is parallel and opposite to a second side 202 of the cavity 200, each of which is bordered and defined by a gate insulator 160 sidewall. A third side 203 and fourth side 204 of each cavity 200 are also parallel and opposite one another, being bordered and defined by remaining second insulator material 180.

Where the method, in forming gate insulator 160 material results in gate insulator 160 bottomwalls formed upon the substrate 50, a bottom side 205 of each cavity 200 may be bordered and defined by gate insulator 160 material, as shown in FIG. 8. In some embodiments, the gate insulator 160 material may then be removed, as by etching or other known material-removal methods, and the gate insulator 160 material re-formed on the gate conductor 150 material. This intermediate process of removing and reforming the gate insulator 160 material may accommodate forming a gate insulator 160 material of optimal electrical quality in the resulting array 300 of vertical transistor devices.

The photomask 190 may be further utilized to remove the sections of the gate insulator 160 material overlaying the substrate 50 so as to expose those sections of the substrate 50 that were covered, as depicted in FIG. 9, before the photomask 190 is removed. Thereafter, the bottom side 205 of each cavity 200 is bordered and defined by the exposed upper surface of the substrate 50. The top side 206 of each cavity 200 remains open.

Figure 10:
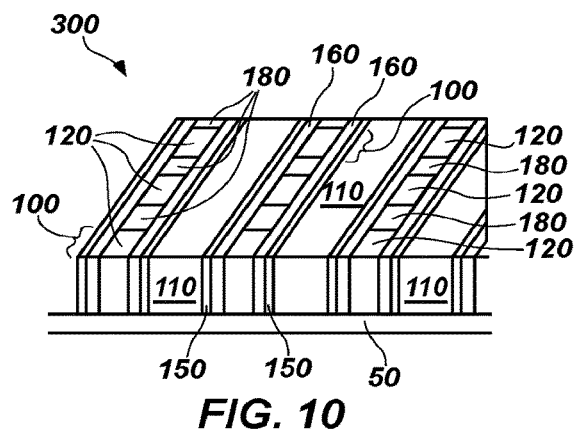

With reference to FIG. 10, the present method for forming a semiconductor device, such as a VFET device 100 or an array 300 of VFETs, further includes filling the cavities 200 with a channel material. The channel material forms mesas 120 bordered, as shown in FIG. 1, on a first side 121 by a first gate insulator 160 sidewall, bordered on a second side 122 by a second gate insulator 160 sidewall, and bordered on a third side 123 and fourth side 124 by remaining second insulator material 180. The mesas 120 of a column of VFET devices may be spaced apart by second insulator material 180.

Filling the cavities 200 with the channel material to form the mesas 120 may be accomplished with any suitable technique, including, without limitation, spin coating, blanket coating, CVD, ALD, plasma-enhanced ALD, PVD, in situ growth, or other known methods. The channel material of the mesas 120 may be, without limitation, amorphous silicon, polycrystalline silicon, epitaxial-silicon, indium gallium zinc oxide (InGaZnOx) ("IGZO"), among others. In one embodiment, the channel material is IGZO.

As depicted in FIG. 10, following the filling of the cavities 200 with the channel material to form the mesas 120, each gate conductor 150 sidewall remains bordered by a gate insulator 160 sidewall and one of the metal seeds 110. The semiconductor device structure of the present disclosure, therefore, may include a first metal seed 110 provided on a first gate conductor 150 sidewall and a second metal seed 110 provided on the second gate conductor 150 sidewall.

As depicted in FIG. 11, the present method may further include removing the metal seeds 110. Removing the metal seeds 110 may be accomplished with any suitable technique, such as etching. Removing the metal seeds 110 produces second trenches 210 positioned between a pair of oppositely-disposed gate conductor 150 sidewalls. Therefore, an array 300 of VFET devices 100 is formed, each VFET device 100 having at least one gate conductor 150.

A method for fabricating a semiconductor device structure is also disclosed. The method comprises forming a plurality of metal seed materials upon a substrate, forming a conductor material upon each of the plurality of metal seed materials to form a plurality of gate conductors, forming an insulator material upon each of the plurality of gate conductors to form a plurality of gate insulators, and filling the first trench with a channel material to form a channel region. A first gate insulator of the plurality of gate insulators is separated from a second gate insulator of the plurality of gate insulators by a first trench.

With further regard to FIG. 11, the disclosed array 300 of vertical transistor devices includes a first plurality of mesas 120 disposed on the substrate 50. The first plurality of mesas 120 may include the mesas 120 of a column of formed VFET devices 100. Each of the mesas 120 of the first plurality of mesas 120 has a first side 121 (FIG. 1) and a second side 122 (FIG. 1) opposite the first side 121. The first sides 121 of the mesas 120 within the first plurality of mesas 120 are aligned with one another, and the second sides 122 of the mesas 120 within the first plurality of mesas 120 are aligned with one another.

The array 300 further includes a first plurality of segments of insulator material, such as segments of remaining second insulator material 180, each of the segments of the second insulator material 180 separating one of the mesas 120 from another mesa 120 within the first plurality of mesas 120.

The array 300 further includes a gate insulator 160 sidewall provided along the first sides 121 of the mesas 120 of the first plurality of mesas 120. A gate conductor 150 sidewall is provided along the gate insulator 160 sidewall. The gate conductor 150 may include graphene in one or more layers. According to the array 300 of vertical transistor devices 100 depicted in FIG. 11, a single gate insulator 160 sidewall and single gate conductor 150 sidewall are components of a single gate 140 extending along the entirety of a column of mesas 120 of VFET devices 100, on the first sides 121 of the mesas 120. Alternatively, a series of separated gates 140 may extend along the first side 121 of the mesas 120 of a column of mesas 120 of VFET devices 100.

The array 300 may further include, as depicted in FIG. 11, a second gate insulator 160 sidewall provided along the second sides 122 of the mesas 120 of the first plurality of semiconductor mesas 120. The array 300 may further include a second gate conductor 150 sidewall provided along the second gate insulator 160 sidewall. The second gate conductor 150 may include graphene in one or more layers. According to the array 300 of vertical transistor devices 100 (FIG. 1) depicted in FIG. 11, a single gate insulator 160 sidewall and single gate conductor 150 sidewall are components of a single gate 140 extending along the entirety of a column of mesas 120 of VFET devices 100, on the second sides 122 of the mesas 120. Alternatively, a series of separated gated 140 may extend along the second side 122 of the mesas 120 of a column of mesas 120 of VFET devices 100.

The mesas 120 within the VFET devices 100 of the array 300 may define channel regions 130 (FIG. 1) passing between the first side 121 and second side 122 of the mesa 120. The channel region 130 may be in communication with a source region (not shown) and drain region (not shown). The source and drain regions may be formed by any suitable technique known in the art.

The array 300 of vertical transistor devices 100 may further include one or more additional pluralities of mesas 120 with the same array 300 as the first plurality of mesas

120. The pluralities of mesas 120 may be spaced from one another, evenly and in parallel, by second trenches 210.

Each column of the array 300 has a width defined by the exterior surfaces of a pair of gate conductor 150 sidewalls, which width C may be the width of each individual VFET device 100. Width C of each VFET device 100 is equal to or about equal to width M (FIG. 2) of the trench separating the originally-formed metal seeds 110. Therefore, the final width C of the VFET device 100 may be scalable by adjusting the width M of the formed metal seeds 110. In addition, the metal seeds 110 are formed at pitch, where "pitch" is known in the industry to refer to the distance between identical points in neighboring features. Notably, the pitch of the metal seeds 110 is equal to or essentially equal to the resulting pitch of the formed VFET devices 100.

An array of vertical transistor devices is disclosed. The array comprises a first plurality of mesas extending above a substrate, a first plurality of segments of insulator material, first gate insulators along the first sides of the mesas of the first plurality of mesas, and first gate conductors along the first gate insulators, the first gate conductors comprising graphene. Each mesa of the first plurality of mesas has a first side and a second side opposite the first side, the first sides aligned with one another, and the second sides aligned with one another. Each segment of insulator material separates one of the mesas from another mesa within the first plurality of mesas.

A method for fabricating an array of vertical transistor devices is also disclosed. The method comprises forming a plurality of metal seeds upon a substrate, forming a conductor material upon each of the plurality of metal seeds to form a plurality of gate conductors, forming a first insulator material upon each of the plurality of gate conductors to form a plurality of gate insulators, filling the first trench with a second insulator material, removing segments of the second insulator material to expose underlying sections of the substrate and to define a plurality of cavities, and filling the plurality of cavities with a channel material to form channel regions bordered on a first side by the first gate insulators and bordered on a second side by the second gate insulators. A first gate insulator of the plurality of gate insulators is separated from a second gate insulator of the plurality of gate insulators by a first trench.

It will be understood that the formed VFET device 100 and array 300 may be thereafter subjected to additional processing to form top contacts, metal interconnects, additional stacked layers of VFET devices 100, arrays 300, and the like, the result of which may be the formation of a cross-point memory array. The additional processing may be conducted by conventional techniques, which are not described in detail herein.

With reference back to FIG. 10, also disclosed is an array 300 of vertical transistor devices 100, wherein the gate conductor 150 sidewalls are further provided along a vertical side of a metal seed 110 line. For example, without limitation, the gate conductor 150 sidewalls of the array 300 of VFET devices 100 may be provided along the first side 111 and/or second side 112 of metal seeds 110.

Figure 12:
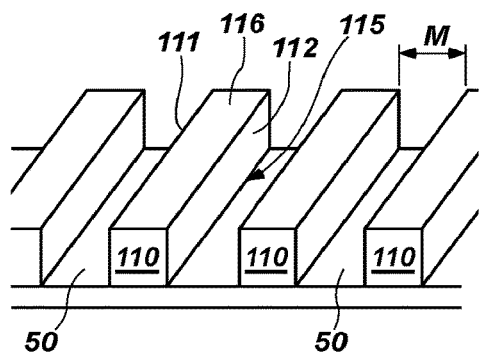
FIGS. 12-21 are cross-sectional, top and front perspective, schematic views of a semiconductor device structure during various stages of processing according to another embodiment of the present disclosure.
Figure 13:
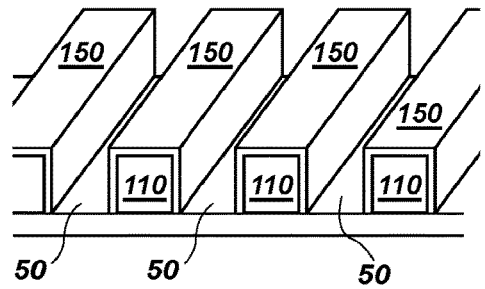

FIGS. 12-21 depict various stages of processing a plurality of vertical transistors in accordance with another embodiment of the present method for fabricating a semiconductor device, such as a VFET device 100, as well as for fabricating an array 300 of vertical transistor devices 100. FIGS. 12 and 13 depict identical stages of processing as those depicted in FIGS. 2 and 3, respectively. The description of FIG. 12 is equivalent to the description of FIG. 2, and the description of FIG. 13 is equivalent to the description of FIG. 3.

Figure 14:
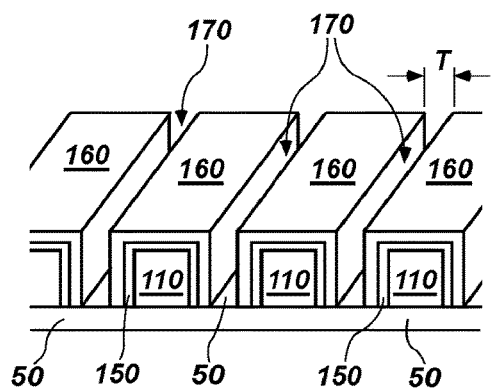

With reference to FIG. 14, the present embodiment of the method for forming a semiconductor device includes, following forming a conductor material upon the metal seeds 110 so as to form a gate conductor 150, forming an insulator material upon each of the plurality of gate conductor 150 sidewalls to form a plurality of gate insulator 160 sidewalls. The method of the present embodiment further includes forming the insulator material upon a gate conductor 150 topwall or top side 116 of the metal seeds 110. The insulator material may be formed conformally. Because the metal seeds 110 may be evenly spaced in parallel from one another, the formed gate insulator 160 sidewalls may be evenly spaced from one another, such that each first trench 170, defined between opposing gate insulator 160 sidewalls, defines a width T (FIG. 14).

The method of the present embodiment includes leaving portions of the substrate 50 located within the first trenches 170 exposed. Leaving the portions of the substrate 50 within the first trenches 170 exposed may be accomplished by forming the insulator material only upon the first side 111, second side 112, and/or top side 116 of the metal seeds 110, but not upon the substrate 50 within the first trenches 170. Leaving the portions of the substrate 50 within the first trenches 170 exposed may alternatively be accomplished by forming the insulator material upon the first side 111, second side 112, and top side 116 of the metal seeds 110 and also upon the substrate 50 within the first trenches 170, followed by removal of the gate insulator 160 bottomwall (i.e., the insulator material covering the substrate 50 within the first trenches 170). The removal of the insulator material may be accomplished by any suitable technique, including etching.

The insulator material of the gate insulator 160 sidewalls may be formed by any suitable technique, including, but not limited to, ALD, plasma-enhanced ALD, PVD, or other known methods. The insulator material of the gate insulator 160 may comprise any suitable insulative material. For example, without limitation, the material of the gate insulator 160 may be an oxide.

Figure 15:
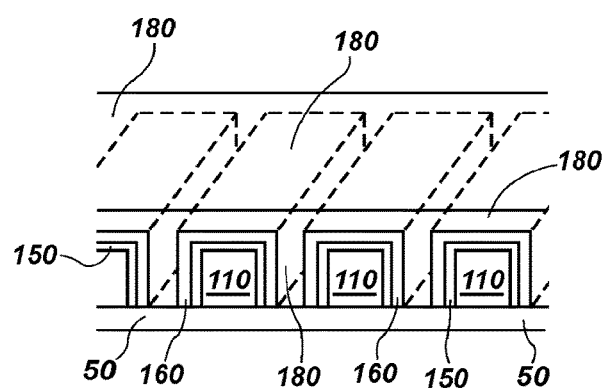

With reference to FIG. 15, the present embodiment of the method may further include filling the first trench 170 (FIG. 14) with a second insulator material 180. The second insulator material 180 may not only fill the first trenches 170, covering the exposed substrate 50, but may also cover the gate insulator 160 top wall. Filling the first trenches 170 with the second insulator material 180 may be accomplished by any suitable method, including, without limitation, by spin coating, blanket coating, CVD, PVD, in situ growth, or other known methods. The second insulator material 180 may be any suitable insulative material. For example, without limitation, the second insulator material 180 may be a conventional ILD material, such as silicon nitride.

Figure 16:
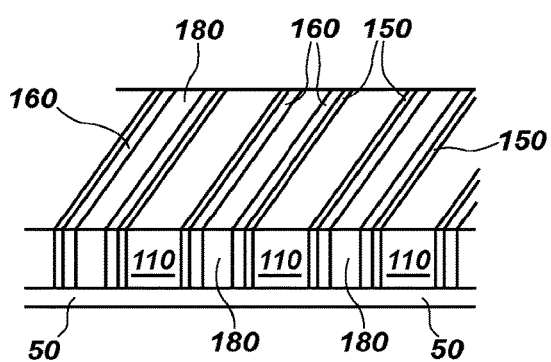

With reference to FIG. 16, the present embodiment of the method may further include, if necessary, removing portions of the second insulator material 180, portions of the gate insulator 160 material, and portions of the gate conductor 150 material, to expose the top sides 116 of the metal seeds 110. This may be accomplished by any suitable method, including, without limitation, abrasive planarization methods such as chemical mechanical polishing or planarization ("CMP") or an etching process.

Figure 17:
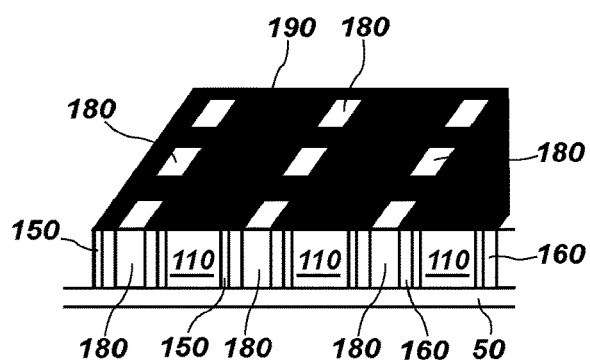
Figure 18:
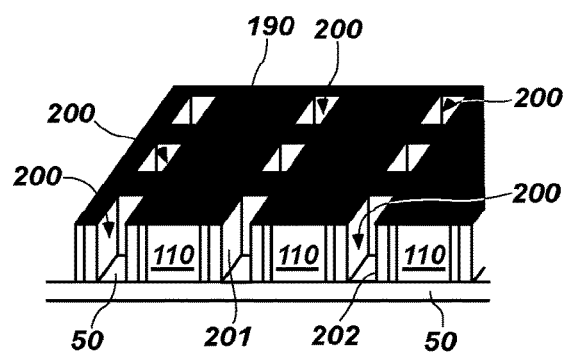
Figure 19:
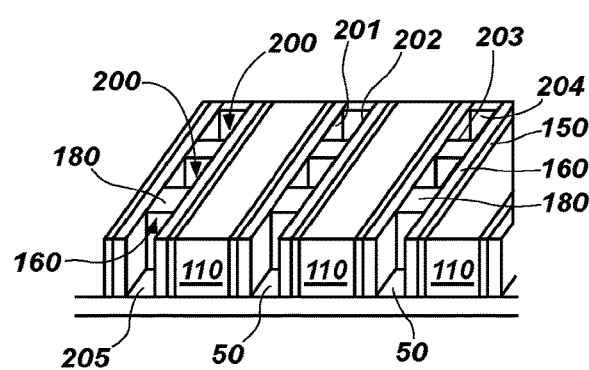

With reference to FIGS. 17 through 19, the present embodiment of the method may further include selectively removing segments of the second insulator material 180 to expose sections of the substrate 50 underlying the segments of second insulator material 180 removed. This may be accomplished as described above with reference to FIGS. 7 through 9.

According to the present embodiment of the method, the bottom side 205 of each cavity 200 is bordered by and defined by an exposed upper surface of the substrate 50. The top side 206 of each cavity 200 remains open.

Figure 20:
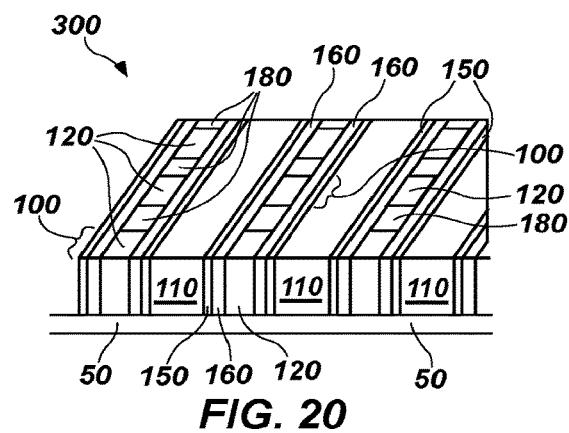

FIGS. 20 and 21 depict identical stages of processing as those depicted in FIGS. 10 and 11, respectively. The description of FIG. 20 is equivalent to the description of FIG. 10, and the description of FIG. 21 is equivalent to the description of FIG. 11.

It will be understood that the formed VFET device 100 (FIG. 1) and array 300, depicted in FIG. 21, may be thereafter subjected to additional processing to form top contacts, metal interconnects, additional stacked layers of arrays 300 of VFET devices 100, and the like, the result of which may be the formation of a cross-point memory array. The additional processing may be conducted by conventional techniques, which are not described in detail herein.

The VFET device 100 and array 300 may be used in a memory access device (not shown) that includes a memory cell (not shown) electrically coupled to the VFET device 100. The memory cell includes a top electrode (not shown) and a bottom electrode (not shown), which is coupled to a contact (not shown) for the drain. The source is coupled to another contact. Upon biasing of the source contact, the gate 140, and the top electrode, the VFET device 100 is turned "on" and current flows through the channel region 130 and memory cell.

While the disclosed device structures and methods are susceptible to various modifications and alternative forms in implementation thereof, specific embodiments have been shown by way of example in the drawings and have been described in detail herein. However, it should be understood that the present invention is not intended to be limited to the particular forms disclosed. Rather, the present invention encompasses all modifications, combinations, equivalents, variations, and alternatives falling within the scope of the present disclosure as defined by the following appended claims and their legal equivalents.

What is claimed is:

1. A semiconductor device, comprising:
   a channel material comprising indium gallium zinc oxide (IGZO) adjacent to a material;
   an insulator material adjacent to opposing sides of the channel material; and
   a conductor material in contact with the material and with the insulator material, the conductor material coextensive with and in direct contact with a height and a width of the insulator material.

2. The semiconductor device of claim 1, wherein the conductor material does not contact the channel material.

3. The semiconductor device of claim 1, wherein the conductor material comprises a thickness of from about one monolayer to about 5 nm.

4. The semiconductor device of claim 1, wherein the conductor material and the insulator material are configured as a gate.

5. The semiconductor device of claim 1, wherein the insulator material comprises silicon oxide or silicon nitride.

6. The semiconductor device of claim 1, further comprising another insulator material adjacent to other opposing sides of the channel material.

7. A semiconductor device, comprising:
   a channel region comprising indium gallium zinc oxide (IGZO) adjacent to a material;
   an insulator material in contact with an entire height and an entire width of the channel region; and
   a conductor material in contact with an entire height and an entire width of the insulator material, a thickness of the conductor material less than a thickness of the insulator material.

8. The semiconductor device of claim 7, wherein the conductor material is separated from the IGZO by the insulator material.

9. The semiconductor device of claim 7, wherein the insulator material and the conductor material do not contact an upper surface of the channel region.

10. A semiconductor device, comprising:
    an array of mesas, the array comprising:
      mesas comprising an indium gallium zinc oxide (IGZO) material adjacent to a material;
      first insulative materials in direct contact with an entire height and an entire width of the mesas;
      second insulative materials in direct contact with an entire height and an entire length of the mesas; and
      conductor materials in direct contact with an entire height and an entire width of the first and second insulative materials, the conductor materials separated from the mesas.

11. The semiconductor device of claim 10, wherein the mesas are configured in an array.

12. The semiconductor device of claim 10, wherein the IGZO material is oriented perpendicular to the material.

13. The semiconductor device of claim 10, wherein the conductor material comprises a thickness of about one monolayer.

14. The semiconductor device of claim 13, wherein the conductor material is configured as a switchable material.

15. The semiconductor device of claim 10, wherein the conductor materials and the first insulative materials comprise gates on sidewalls of the mesas.

16. The semiconductor device of claim 10, wherein the mesas are oriented parallel to one another and evenly spaced from one another.

17. A semiconductor device, comprising:
    a channel material comprising indium gallium zinc oxide (IGZO) adjacent to a material;
    an insulator material in contact with an entire height and an entire width of one or more sides of the channel material; and
    a conductor material in contact with an entire height and an entire width of the insulator material, a thickness of the conductor material less than a thickness of the insulator material.

18. The semiconductor device of claim 17, wherein the insulator material is in contact with the entire height and the entire width of one side of the channel material.

19. The semiconductor device of claim 18, wherein the conductor material and the insulator material comprise a gate on one channel material.

20. The semiconductor device of claim 17, further comprising an electrode, a source, and a drain in operable communication with the channel material.

21. The semiconductor device of claim 20, wherein the semiconductor device is configured as a vertical transistor.

* * * * *